(12) United States Patent
Hsieh

(10) Patent No.: US 6,498,030 B2
(45) Date of Patent: Dec. 24, 2002

(54) SURROUNDING-GATE FLASH MEMORY HAVING A SELF-ALIGNED CONTROL GATE

(75) Inventor: Tsong-Minn Hsieh, Miaoli (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/925,337

(22) Filed: Aug. 9, 2001

(65) Prior Publication Data

US 2002/0033500 A1 Mar. 21, 2002

Related U.S. Application Data

(62) Division of application No. 09/630,868, filed on Aug. 2, 2000.

(51) Int. Cl.⁷ .............................................. H01L 29/788
(52) U.S. Cl. ....................................... 435/257; 435/263
(58) Field of Search ................................. 438/257, 263, 438/264

(56) References Cited

U.S. PATENT DOCUMENTS 6,207,503 B1 * 3/2001 Hsieh et al.
6,214,665 B1 * 4/2001 Sakui et al.
6,240,233 B1 * 7/2002 Hsieh et al.

FOREIGN PATENT DOCUMENTS

EP           0308316 A1 *  3/1989

* cited by examiner

Primary Examiner—Stephen D. Meier

(57) ABSTRACT

The structure of a flash memory is described. Device isolation structures are located on the substrate. Sources are provided on the top layer of the substrate between two device isolation structures. Tunneling oxide layers are provided at both ends of the device isolation structures and on the substrate where the sources are present. Drains are provided in the top layer of the substrate where the tunneling oxide layer is absent in between the device isolation structures. Polysilicon blocks are extended across the ends of two device isolating structures, above the tunnel oxide layer. A silicon oxide cap layer is located on the polysilicon block. The silicon oxide layers are formed on the sidewalls of the polysilicon blocks. The polysilicon layer is on the sidewall of the polysilicon blocks and the polysilicon blocks are separated by the silicon oxide layer. The silicon oxide layer covers the surface of the polysilicon layers. Another polysilicon layer, which is located on the tunnel silicon oxide layer above the sources also, covers a part of the silicon oxide cap layer.

10 Claims, 11 Drawing Sheets

SURROUNDING-GATE FLASH MEMORY HAVING A SELF-ALIGNED CONTROL GATE

This application is a divisional of Ser. No. 09/630,868 filed on Aug. 2, 2000 pending at time of issue.

BACKGROUND OF THE INVENTION

1. Field of Invention

The present invention relates to the structure and the manufacturing process of a surrounding-gate flash memory cell. More particularly, the present invention relates to a surrounding-gate flash memory having a self-aligned control gate.

2. Description of the Related Art

The nonvolatile memory cells have been widely used in various electronic components for the storage of structural information, the programming of information or information that can be repeatedly accessable. A flash memory is an erasable programmable read-only memory (EPROM) or an electrically erasable programmable read-only memory (EPPROM). Since the information in a flash memory can be stored, read and erased many times, there is increasing demand for the flash memory in the semiconductor market.

Two gates are generally provided in a flash memory cell, one of which is the floating gate formed by polysilicon for the storage of electrical charges and the other of which is the control gate to control the access of information. The floating gate is located under the control gate and is often in the state of "floating" without connecting to any circuitry. The control gate is usually connected to a wordline. A characteristic of the flash memory cell is its high speed "block-by-block" in the erasure of the stored data and is usually accomplished within 1 to 2 seconds. The "block-by-block" erasure process is much faster than the typical "bit-by-bit" EPROM erasure process, which requires at least several minutes.

As the device integration becomes higher, the coupling ratio of a control gate becomes smaller and the operation voltage needs to be raised. The application of the floating gate transistor structure in a conventional flash memory therefore limited in highly integrated. In the trend of increasing the writing and erasure speed and lowering the operation voltage of a flash memory, increasing the coupling ratio of the control gate has become the only solution. The potential of a floating gate can be increased as the coupling ratio of the control gate is increased Increasing the coupling ratio of the control gate, however, is inevitable to increase the capacitance between the floating gate and control gate. One way of increasing the capacitance is to reduce the thickness of the insulation layer, the other way is to increase the area of the capacitor or to use a high dielectric constant insulation material.

SUMMARY OF THE INVENTION

Based on foregoing, a surrounding-gate flash memory cell having a greater capacitor area between the control gate and the floating gate, and a higher coupling ratio for the control gate at the same integration as a conventional flash memory is provided.

The writing, reading and erasing of a flash memory are related to the coupling ratio of the control gate. The coupling ratio of the control gate of each flash memory cell unit has to be the same to avoid a faulty operation. It is, therefore, very important to control the area of the capacitor between the control gate and the floating gate in each flash memory cell unit. A micro-patterning process is used in forming the control gate of a flash memory in the conventional method. As the device integration gets higher, the window of the photo resist process becomes smaller. In such a case, it is possible to cause a difference in the operational voltage between different flash memory cell units due to misalignment. The flash memory is formed by an array of a plurality of flash memory cell units. A faulty operation thereby occurs when there is a difference in the operational voltage between the cell units in the same flash memory. The present invention is to provide a self-aligned method of forming the control gate and to ensure the same capacitor area between the control gate and the floating gate in each flash memory cell unit.

The same tunneling oxide layer is used for the electron transfer in the programming and the erasure of the information of a conventional floating gate flash memory, which may lead to the damage of the device easily. The present invention further provides a surrounding-gate flash memory comprising of control gates, floating gates and erasure gates. Moreover, the writing and the erasure of information are carried out at different silicon oxide layers to prevent the device from being damaged and to increase the lifetime of the device.

According to the present invention, a surrounding-gate flash memory having self-aligned control gates is provided. Such surrounding-gate flash memory is disclosed as the following:

A plurality of device isolation structures formed by a shallow trench isolation method or by a local oxidation method, are provided on a substrate. These device isolation structures are arranged in the form of a chessboard, with one row as a region and each region containing a plurality of the device isolation structures. The source regions are located in the substrate and are between neighboring regions of the device isolation structures. The tunneling silicon oxide layers are located at both ends of each device isolation structure region and on the substrate the source regions are located. The drain regions are located in the substrate without the tunneling oxide layer which are located between each two device isolation structures in the same region and two drain regions are isolated by the device isolation structures in the same region.

A group of polysilicon block comprises a polysilicon block extended across the same ends of every two device isolation structures, above the tunnel oxide layer. On the other ends of the same device isolation structures also extends another polysilicon block to form the other group of polysilicon block. Thus, two groups of polysilicon block are present in a same region of the device isolation structures. These polysilicon blocks are used as floating gates and these polysilicon blocks are located above the tunneling oxide layer. The distance between a polysilicon block and an adjacent polysilicon block is not the same. The distance between the polysilicon blocks in the same group is smaller than that in different groups. The distance between the polysilicon blocks in the same group is also smaller than the distance between the device isolation structures in the same region. A silicon oxide cap formed by local oxidation is provided over each polysilicon block. A first silicon oxide layer is formed on the sidewall of each polysilicon block. These silicon oxide layers are positioned above the tunneling oxide layers as well.

First polysilicon layers are provided on the sidewalls of the polysilicon blocks and above the tunneling oxide layers to connect the polysilicon blocks in the same group and separated from the polysilicon blocks by the first silicon oxide layer. Tile height of the first polysilicon layer is lower than that of the polysilicon blocks. These first polysilicon layers are used as control gates and as word lines. Second silicon oxide layers are provided on the surfaces of the first polysilicon layers. Further, the second polysilicon layers are provided above the tunnel silicon oxides above the sources. These second polysilicon layers located on the device isolation structures in the different regions but in between the adjacent polysilicon blocksform a T-shaped structure, which covers the half parts of the polysilicon blocks adjacent to the sources. These second polysilicon layers are used as erasure gates.

A dielectric layer covers all of the above constituting elements. Plugs are provided in the dielectric layer. The lower end of one plug is electrically connected to the drain. Conductive lines are provided above the dielectric layer and the conductive lines do not intersect. Each conductive line is electrically connected to the upper end of one plug exposed in the surface of the dielectric layer, and only connected to one of the drains in each group of the drains by one plug. These conductive lines are used as bit lines.

Further, two dummy polysilicon blocks which are side-by-side and having a smaller size are provided at both ends of each group of the polysilicon blocks. The dummy polysilicon blocks is to provide the position for forming the conductive plugs of the control gates.

According to the preferred embodiment of the present invention, a method for fabricating the above structure of the surrounding-gate flash memory having self-aligned control gates is provided. A substrate is first provided. Device isolation structures are provided on the substrate. The device isolation structures are roughly parallel to each other, and arranged in the form of a chessboard. Each row of the device isolation structures form a region and every region of the device isolation structures includes a plurality of the device isolation structures. A strip-shaped source region is provided between each two regions of the device isolation structures. A block-shaped drain region is provided between the device isolation structures in each region. The method of forming these device isolation structures comprises shallow trench isolation or local oxidation.

On the surface of the substrate, a tunnel silicon oxide and a first polysilicon layer are sequentially formed. The method of forming the tunneling oxide layer comprises thermal oxidation. The method of forming the first polysilicon layer comprises chemical vapor deposition. A field silicon oxide isolating layer is formed by local oxidation over the first polysilicon layer. The polysilicon layer is etched by using the field silicon oxide isolation as mask. A polysilicon block and a dummy polysilicon block having the field silicon oxide isolating layer. The method of etching the first polysilicon layer includes selectively anisotropic etching.

A patterned photoresist layer is formed by the known lithography to allow said strip-shaped source region to be exposed. The source is formed in the source region. The method of forming the source includes ion implantation. The photoresist layer is removed. A first silicon oxide is formed on the sidewall around the polysilicon block. The method of forming the first silicon oxide includes thermal oxidation.

A conformal second polysilicon is formed over said substrate. The method of forming the polysilicon layer includes low-pressure chemical vapor deposition or plasma-enhanced vapor deposition. The conformal polysilicon layer is etched. The second polysilicon layer is etched and the tunneling oxide layer is used as etching-stop layer. The method of etching polysilicon layer includes selectively anisotropic etching of the polysilicon/silicon oxide.

A second silicon oxide is formed on the surface of said the etched second polysilicon layer. The method of forming the second silicon oxide includes thermal oxidation or chemical vapor deposition. A third polysilicon layer is formed over the whole surface of the substrate. The method of forming the third polysilicon layer includes chemical vapor deposition. A plurality of openings is formed in said third polysilicon layer. The drain regions, a part of the second silicon oxide and a part of said field silicon oxide isolating layer are exposed through the openings. The method of forming the openings includes known lithography and anisotropic etching. Drains are formed in the drain region. The method of forming the drains includes ion implantation. The tunneling silicon oxide located over the drains is removed.

A dielectric layer is formed. The method of forming the dielectric layer includes chemical vapor deposition. The dielectric layer covers all of the constituting elements. The material for the dielectric layer includes silicon oxide. Plugs are formed by known process for forming plugs in the dielectric layer. The lower ends of the plugs are electrically connected to the drains, and the upper ends thereof are exposed on the surfaces of the dielectric layer. A plurality of conductive lines is formed over the dielectric layer by known process to be connected to the upper ends of the plugs.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principle of the invention. In the drawings.

FIGS. 2a to 10a show the schematic cross-sectional views of the process for fabricating the surrounding-gate flash memory having self-aligned control gates according to the present invention, along the sectional line I-I' in the FIG. 1;

FIGS. 2b to 10b show the schematic cross-sectional views of the process for fabricating the surrounding-gate flash memory having self-aligned control gates according to the present invention, along the sectional line II-II' in the FIG. 1;

DESCRIPTION OF THE PREFERRED EMBODIMENTS

Figure 1:
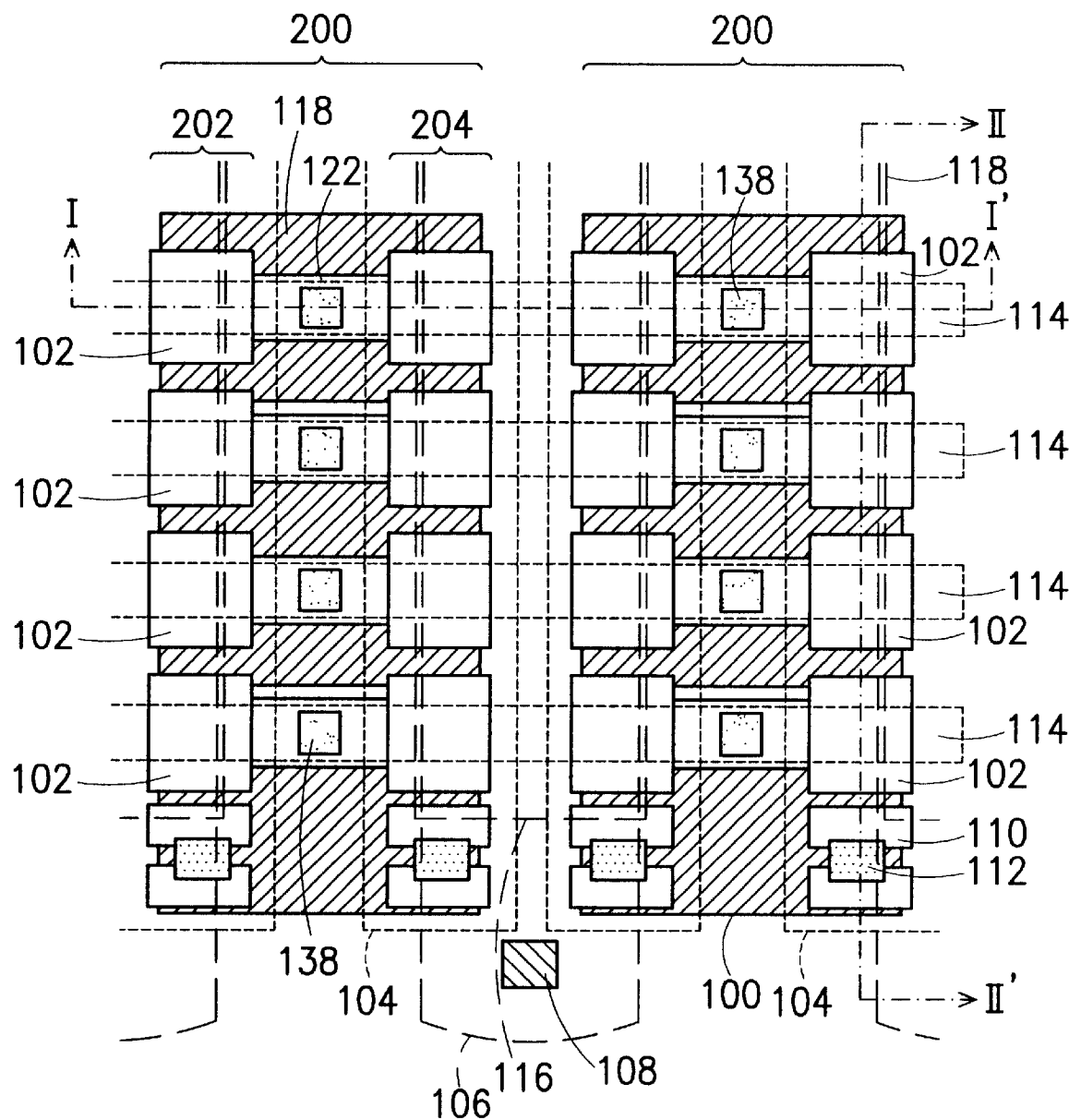
FIG. 1 shows the top view of the surrounding-gate flash memory having self-aligned gates according to the present invention.

Referring to FIG. 1, a top view of the surrounding-gate flash having self-aligned control gates according to the present invention is shown. A plurality of device isolation structures 118 is provided on a substrate 100. The device isolation structures 118 of the same row form a region 200. Each region 200 comprises a plurality of the device isolation structures 118, and the plurality of the device isolation structures 118 of each region 200 are arranged roughly parallel to each other. Source regions 106 are located in the substrate 100 between every two regions 200 of the device isolation structures 118. The tunneling oxide layers 120 (not shown in the drawings) are located at the both ends of the device isolation structures 118 in each region 200 and on the substrate 100 where the source regions 106 are located. The drain regions 122 are located in the substrate 100 where there is no tunneling oxide layer 120 between the device isolation structures of the each region 200. Two drain regions 122 are separated form each other by the device isolation structures 118 of the respective region 200.

A polysilicon block 132 (not shown in the drawings) is extended across every two device isolation structures 118 on the same ends of the device isolation structures 118. Two clusters of the polysilicon blocks 202, 204 are provided on the same region 200 of the device isolation structures 118. The distance between a polysilicon block 132 and the adjacent polysilicon block 132 is not necessary the same. The distance between the polysilicon blocks 132 in the same group 202 is smaller than that in the different groups 202 and 204 of the polysilicon blocks 132. The distance between the polysilicon blocks 132 in the same group 202 is also smaller than the distance between the device isolation structures 118 in the same region 200. A silicon oxide cap layer 102 formed by local oxidation is provided over each polysilicon block 132. A silicon oxide layer 142 (not shown in the drawings) is formed on the sidewall of each polysilicon block 132. The silicon oxide layer 142 is positioned on the tunneling oxide layer 120.

Polysilicon layers 104 are provided on the sidewalls around the polysilicon blocks 132 and over those tunneling silicon oxides 120. They are connected to the polysilicon blocks 132 in the same group 202 and separated from the polysilicon blocks 132 by silicon oxide layer 142. The height of the polysilicon layer 104 is lower than that of the polysilicon blocks 132. Silicon oxide layers 150 are provided on the surfaces of the polysilicon layers 104. Further, polysilicon layers 116 are provided on the tunneling oxide layer 120 above the source regions 106. The polysilicon layers 116 are located on the device isolation structures 118 of the different regions 200, but is between the adjacent polysilicon blocks 132 to form a T-shaped structure. These polysilicon layers116 also cover half of the polysilicon blocks 132 adjacent to the source regions 116.

A dielectric layer 156 (not shown in Figure) covers all of the above structures. Plugs 108, 112, 138 are provided in the dielectric layer 156, wherein the plug 108 is used as a source contact, the plug 112 is used as a gate contact and the plug 138 is used as a drain contact. The lower end of the plug 138 is electrically connected to the drain 122. Conductive lines 114 are provided on the dielectric layer 156 and the conductive lines 114 do not intersect with each other. Each conductive line 114 is electrically connected to the upper end of the plug 138 exposed on the surface of the dielectric layer 156, and is only connected to one of the drains 112 in each group of the drains 112 through the plug 138.

Figure 2A:
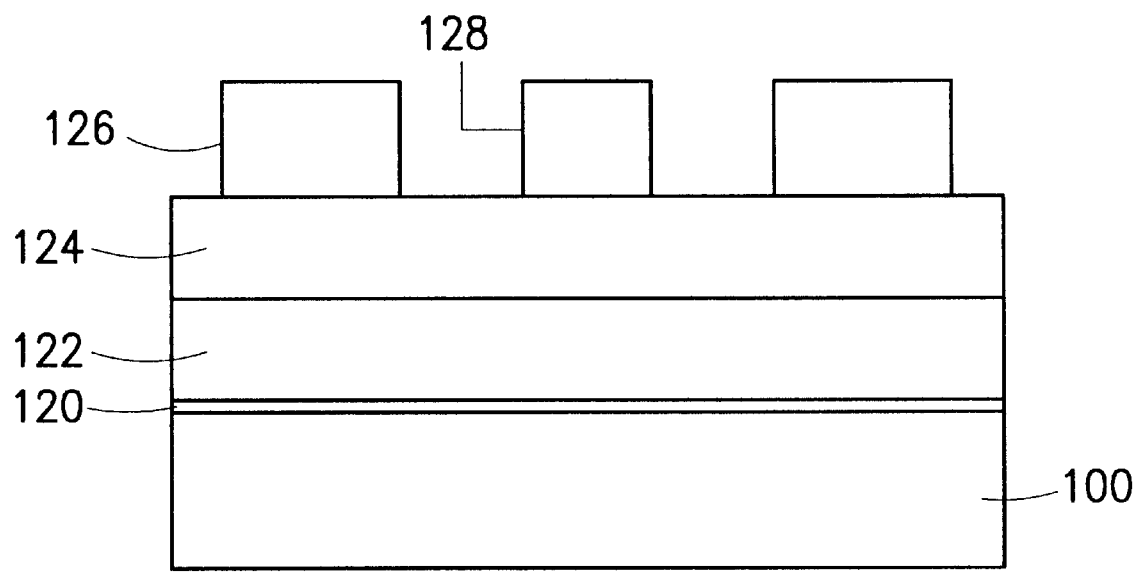
Figure 2B:
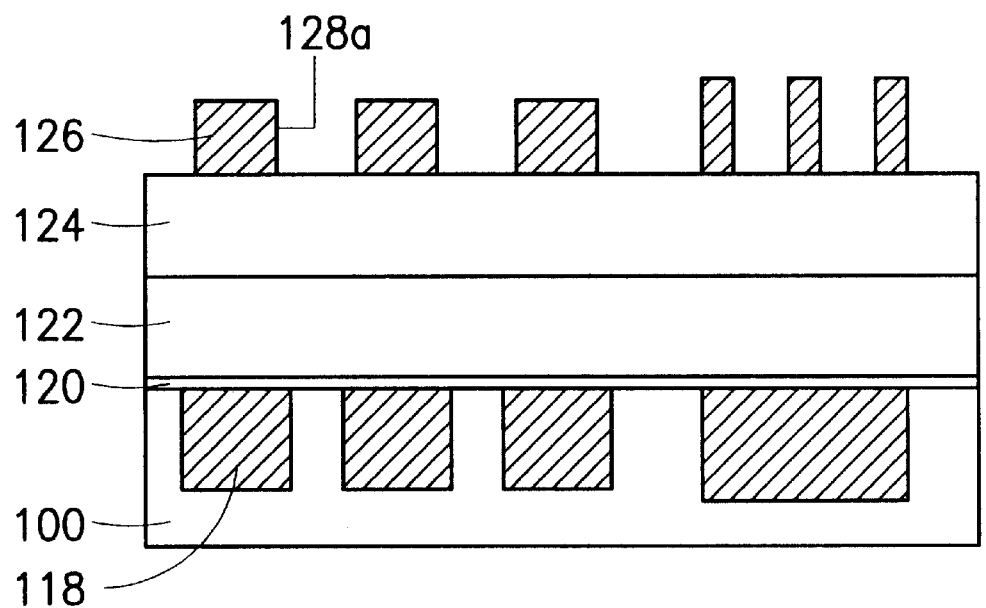

According to a preferred embodiment of the present invention, a method for fabricating the above structure of the surrounding-gate flash memory having self-aligned control gates is provided. As shown in FIGS. 2a and 2b, a substrate 100 is provided. Device isolation structures 118 (only in FIG. 2b) are provided on the substrate 100. The device isolation structures 118 are roughly parallel to each other, and are arranged in the form of a chessboard. Referring to FIG. 1, each region 200 of the device isolation structures 118 includes a plurality of the device isolation structures 118 and the device isolation structures 118 in the same region 200 are roughly parallel to each other. A strip-shaped source region 106 is provided between the device isolation structures 118 of each two regions 200. A drain region 122 in the form of a block is provided between the device isolation structure 118 in each region 200.

On the surface of the substrate 100, a tunneling oxide layer 120, a polysilicon layer 122, a mask layer 124 and a patterned photoresist layer 126 are sequentially formed. The tunneling oxide layer 120 is formed by, for example, thermal oxidation. The polysilicon layer 122 is formed by, for example, chemical vapor deposition. The mask layer 124 includes chemically vapor deposited silicon nitride. Openings 128 and 128a are provided in the patterned photoresist layer 126. The openings 128 and 128a expose the underlying mask layer 124.

Figure 3A:
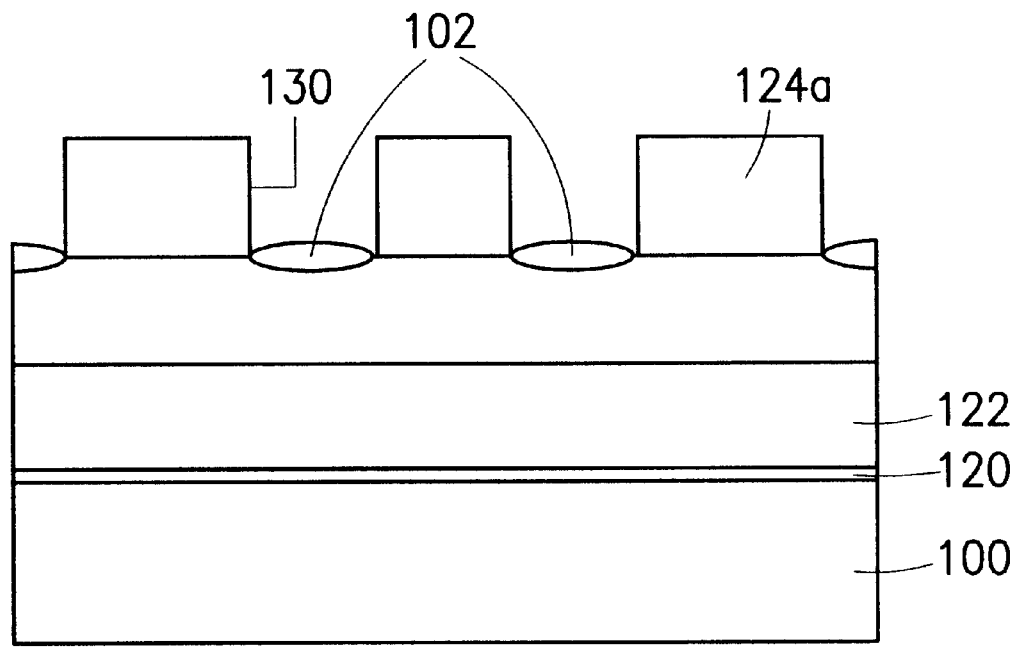
Figure 3B:
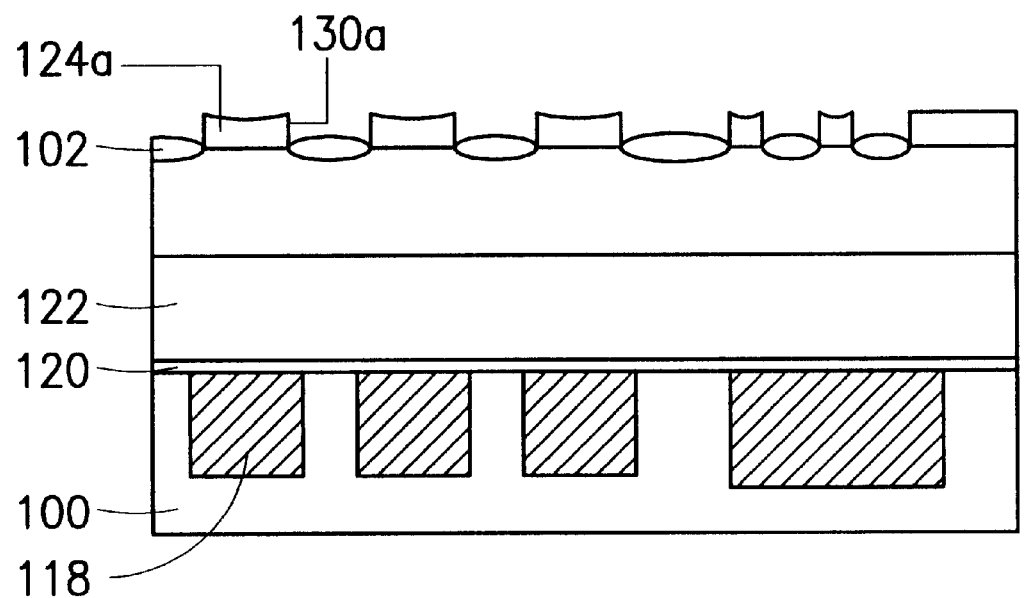

Referring to FIGS. 3a and 3b, using the patterned photoresist layer 126 as a mask, the mask layer 124 is etched to form the mask layer 124 having openings 130 and 130a. The mask layer 124 is etched by, for example, anisotropic etching. The openings 130 and 130a expose the polysilicon layer 122 thereunder. Thereafter, the photoresist 128 is removed. Field silicon oxide isolation layer 102 is formed on the polysilicon layer 122 by local oxidation using the mask layer 124a as a mask.

Figure 4A:
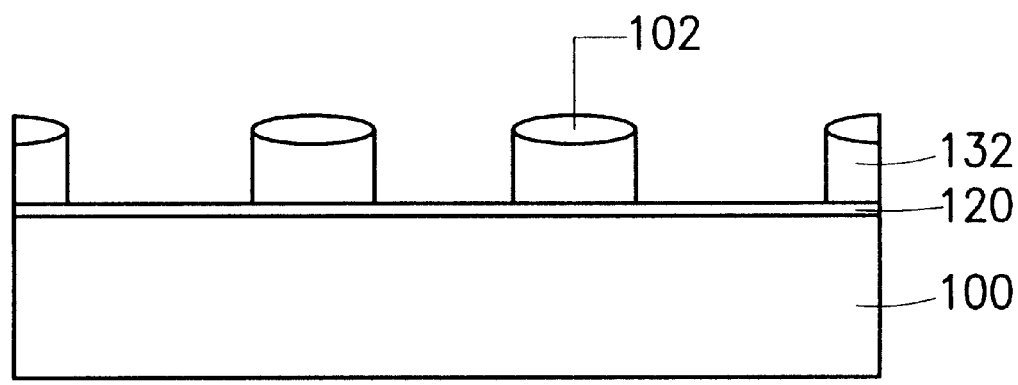
Figure 4B:
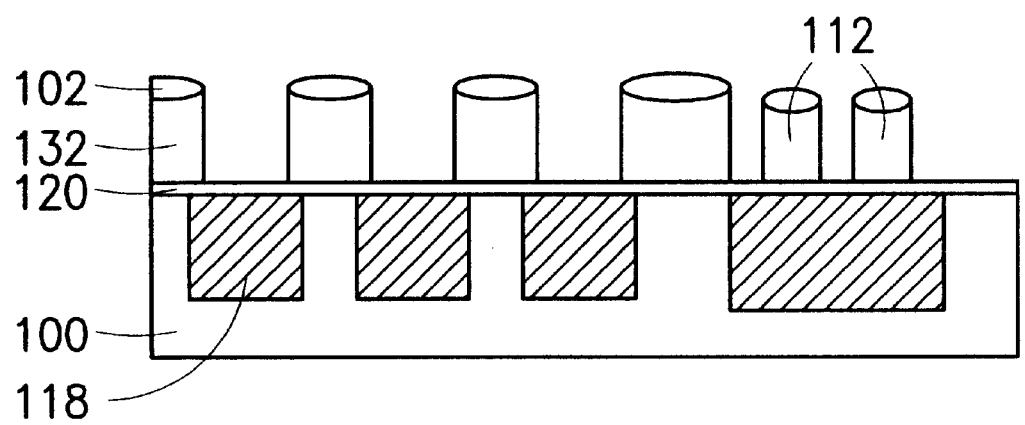

As shown in FIGS. 4a and 4b, the mask layer 124a is removed. Removing the mask layer 124a includes by selectively anisotropic etching. The polysilicon layer 122 is etched using the field silicon oxide isolation layer 102 as a mask and the tunneling oxide layer 120 as a etching-stop layer to form a polysilicon block 132 and a dummy polysilicon block 132 having the field silicon oxide isolation layer 102 at the upper ends thereof (shown in FIG. 4b). The method of forming the polysilicon block 132 and dummy polysilicon block 112 includes selectively anisotropic etching of polysilicon/silicon oxide.

Figure 5A:
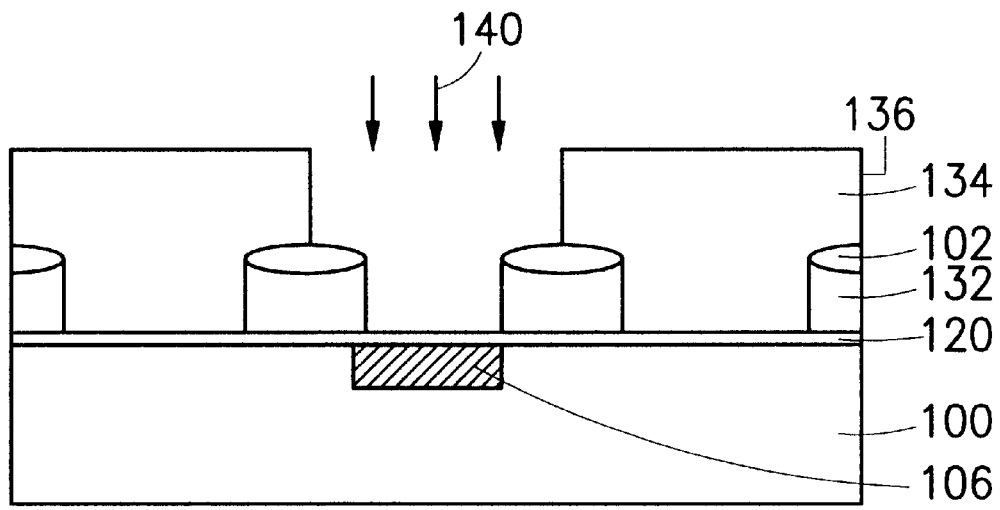
Figure 5B:
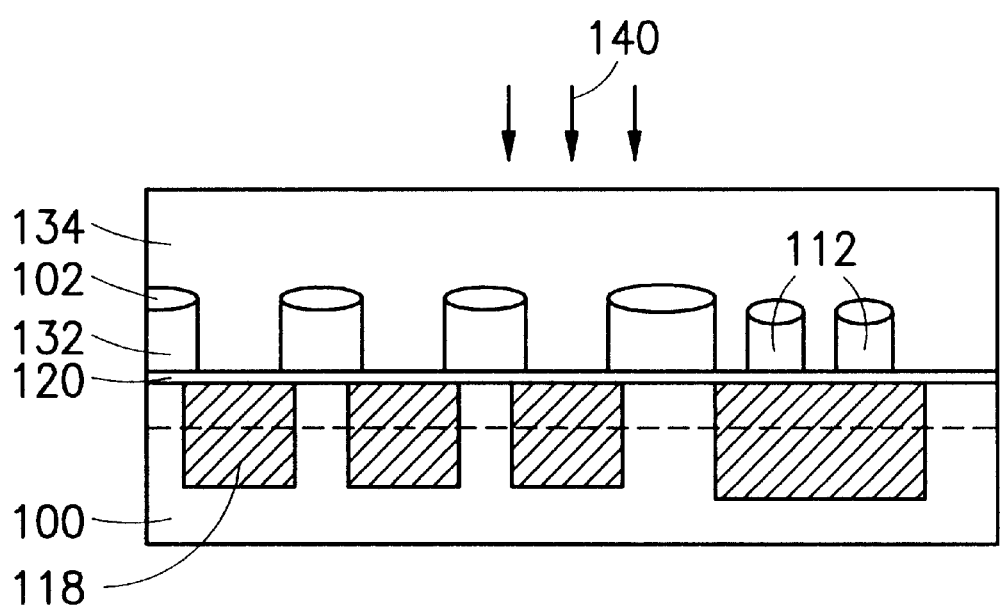

Referring to FIGS. 5a and 5b, a patterned photoresist layer 134 is formed by conventional photolithography. The strip-shaped source regions 106 are exposed through the openings 136 of the photoresist layer 134. The source regions 106 are formed by methods including ion implantation 140.

Figure 6A:
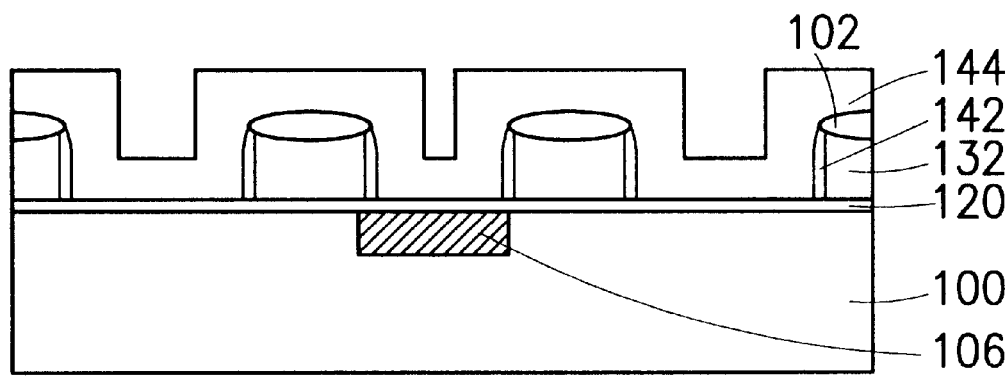
Figure 6B:
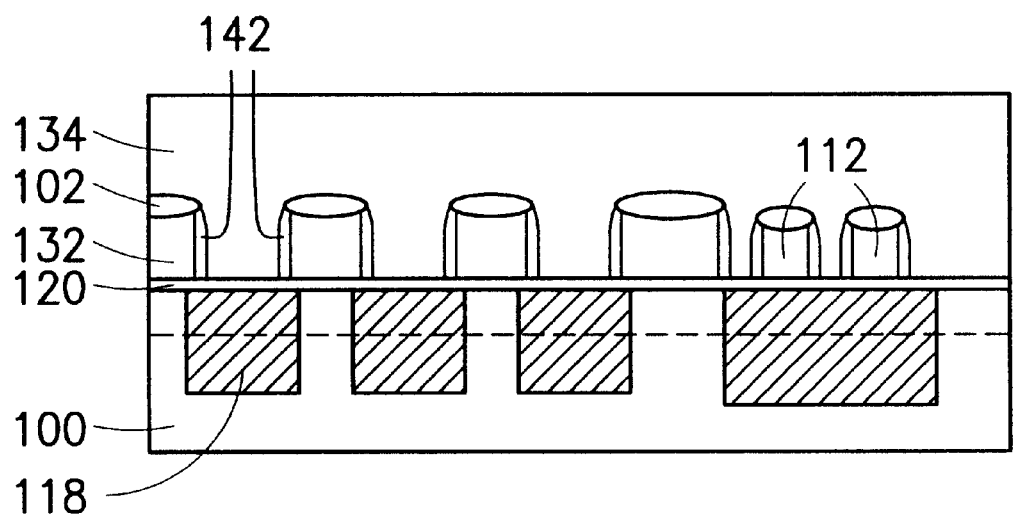

Referring to FIGS. 6a and 6b, the photoresist layer 134 is removed. A silicon oxide layer 142 is formed on the sidewall of the polysilicon block 132. The method of forming the silicon oxide layer 142 includes thermal oxidation. A conformal polysilicon layer 144 is formed on tunneling oxide layer 120 of the polysilicon block 132. The method of forming the polysilicon layer 144 includes low-pressure chemical vapor deposition or plasma-enhanced chemical vapor deposition.

Figure 7A:
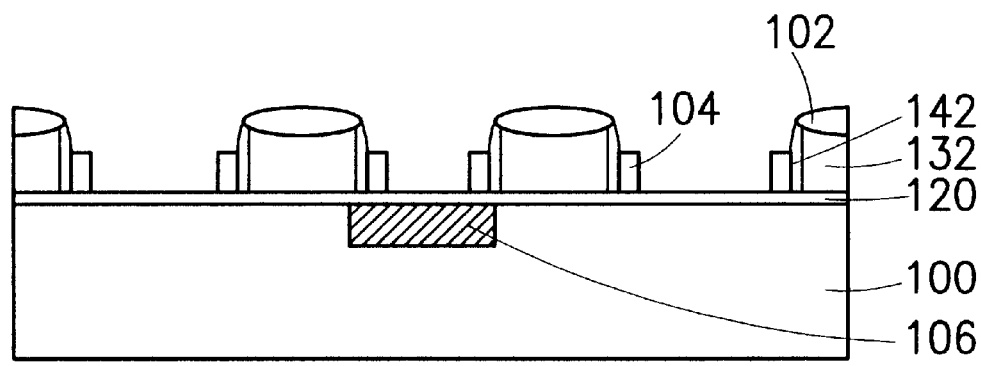
Figure 7B:
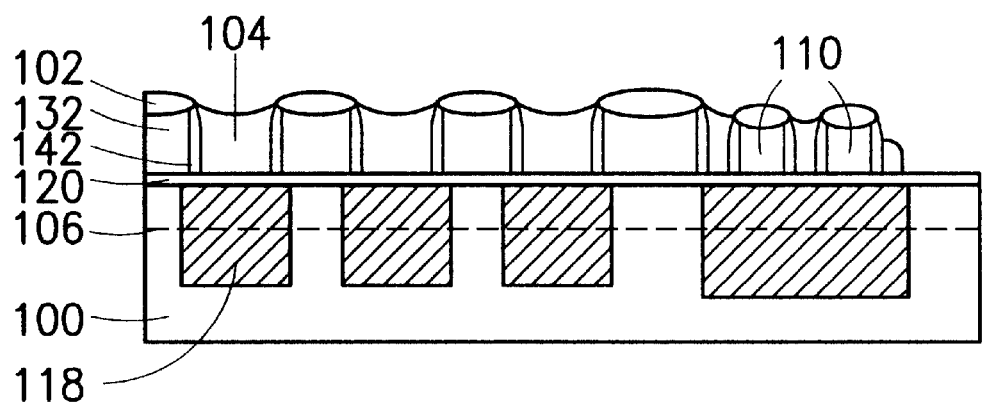

Referring to FIGS. 7a and 7b, the conformal polysilicon layer 144 is etched using the tunneling oxide layer 120 as a etching-stop layer. The method of etching the polysilicon layer 144 includes selectively anisotropic etching polysilicon/silicon oxide.

Figure 8A:
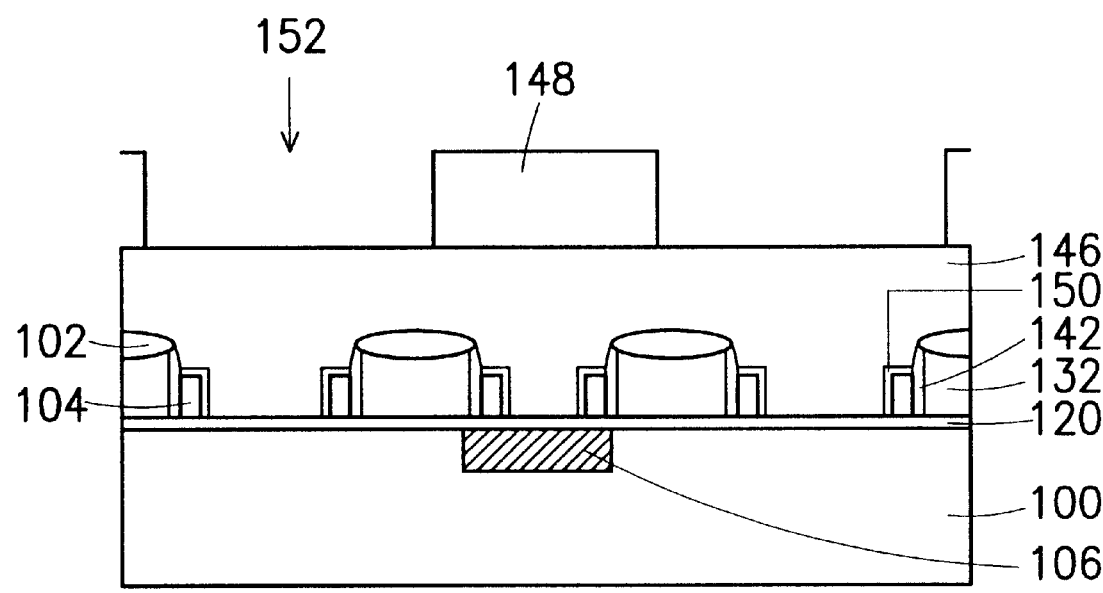
Figure 8B:
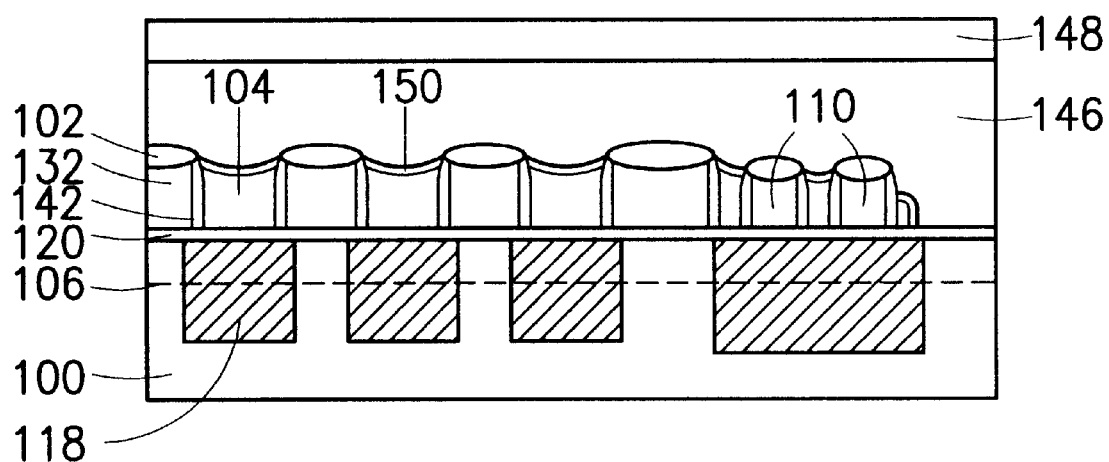

Referring to FIGS. 8a and 8b, the silicon oxide layer 150 is formed on the surface of the polysilicon layer 104. The method of forming the silicon oxide layer includes thermal oxidation or chemical vapor deposition. A polysilicon layer 146 is formed to cover the surface of the substrate 100. The method of forming the polysilicon layer 146 includes chemical vapor deposition. A patterned photoresist layer 148 is formed on the polysilicon layer 146. The openings 152 in the photoresist layer 148 (shown only in FIG. 8a) expose the polysilicon layer 146 thereunder.

Figure 9A:
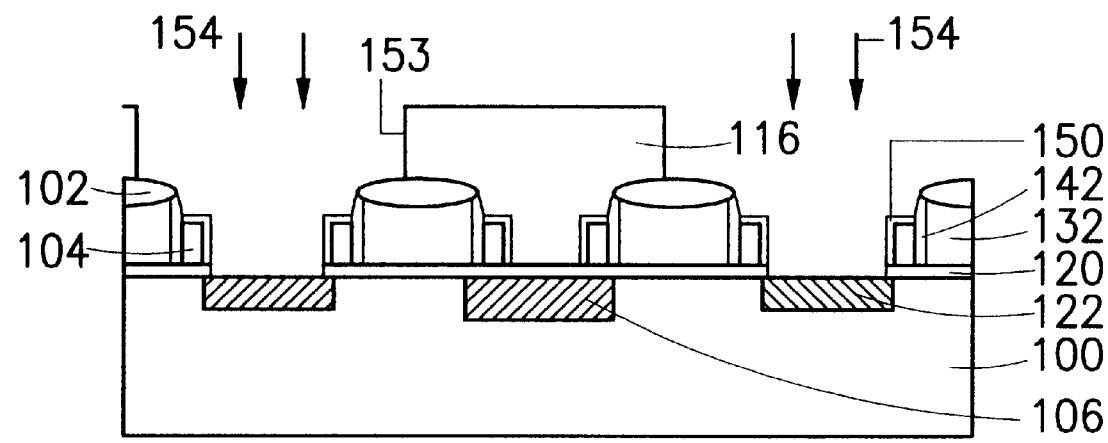
Figure 9B:
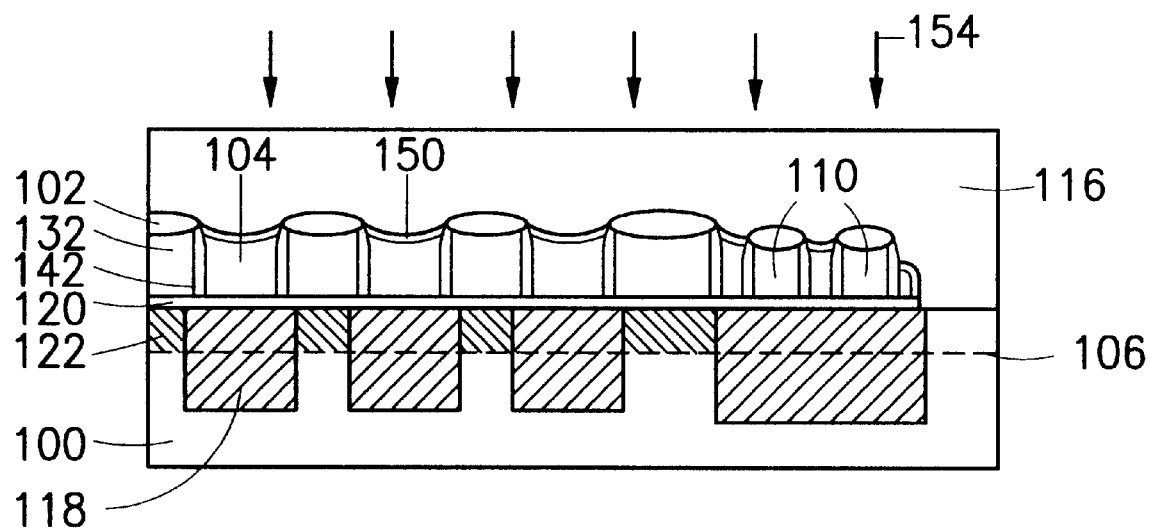

Referring to FIGS. 9a and 9b, openings 153 are formed in the polysilicon layer 146 by using the photoresist 148 as a mask to etch the polysilicon layer 146. The drain regions 122, a part of the silicon oxide layer 150 and a part of the field oxide silicon isolation layer are exposed by the openings 153. The polysilicon layer 116 is defined by the two openings 153. The method of forming the openings 153 includes selectively anisotropic etching of polysilicon/silicon oxide. Drain regions 122 are formed by ion implantation 154. The exposed tunneling oxide layer 120 is then removed.

Figure 10A:
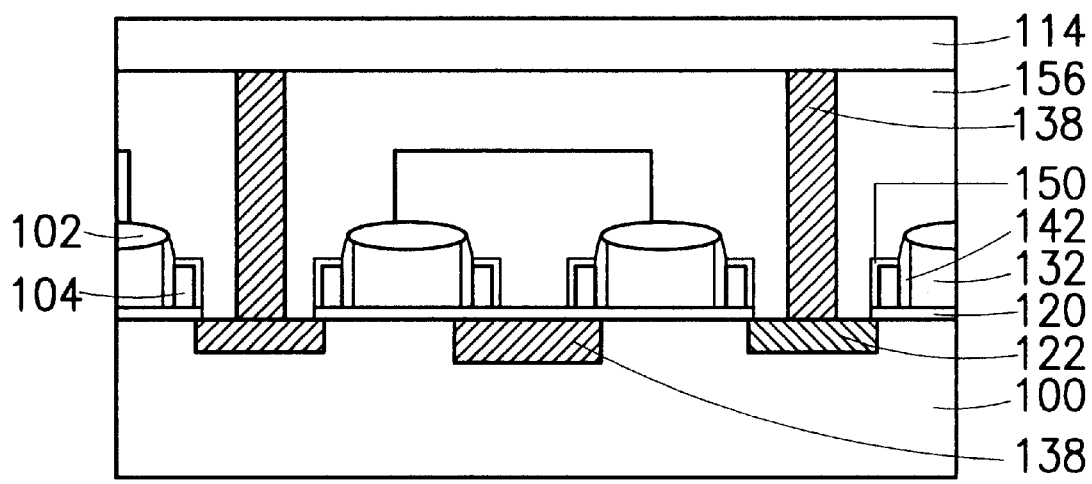
Figure 10B:
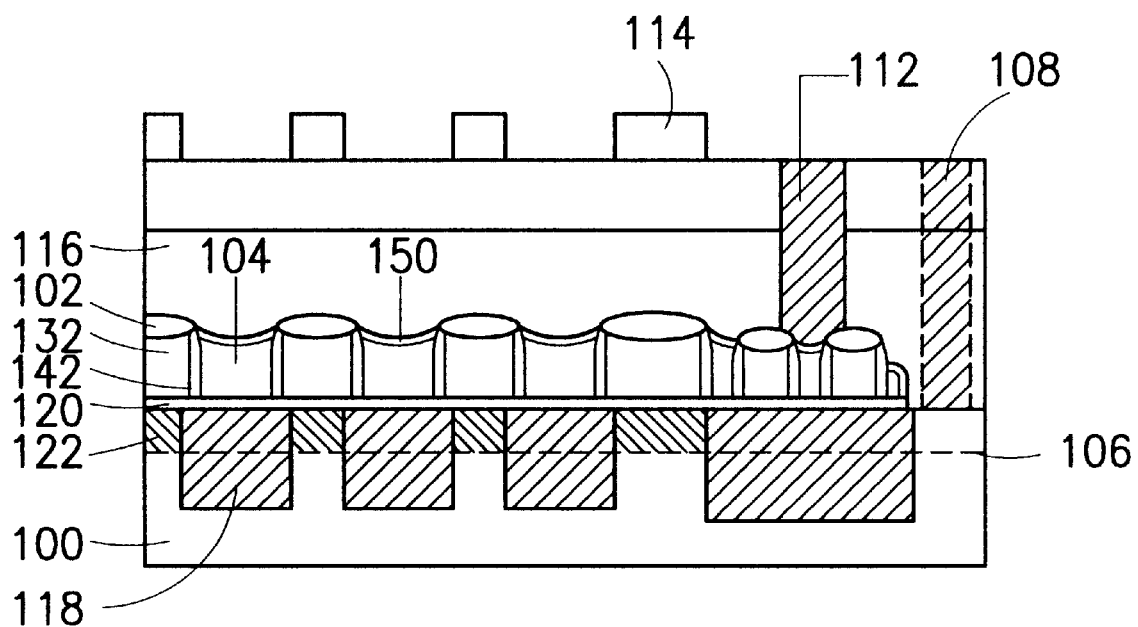

Referring to FIGS. 10a and 10b, a dielectric layer 156 is formed. The method of forming the dielectric layer 156 includes chemical vapor deposition. The dielectric layer 156 covers all the above structures. A material for the dielectric layer 156 comprises silicon oxide. Plugs 108, 112 and 138 are formed in the dielectric layer 156 by the known process of forming plugs. Refer to FIG. 1, the lower end of the plugs 138 is electrically connected to the drain 122 and the upper end thereof is exposed on the surface of the dielectric layer 156. Conductive lines 114 are formed on the dielectric layer 156 by known process forming conductive lines. The conductive lines are electrically connected to the upper end of the plugs 138. Referring to FIG. 10b, the lower end of the plugs 108 is electrically connected to the source 106. The silicon oxide layer 150 on the top of the polysilicon layer 104 between two dummy polysilicon blocks 110 is removed before the plug 112 is formed. The lower end of the plug 112 is electrically connected to the polysilicon layer 104.

Figure 11:
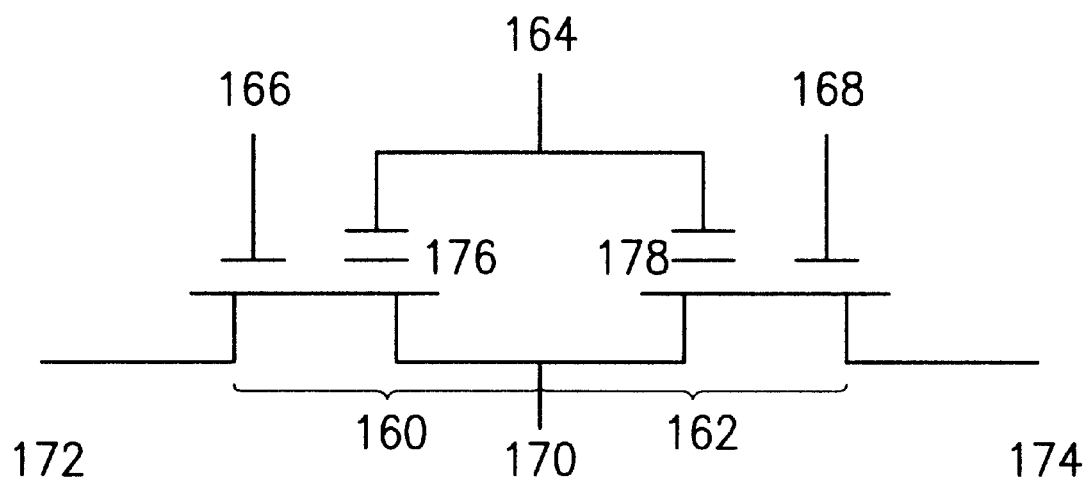
FIG. 11 shows the schematic view of the circuits of the surrounding-gate flash memory having self-aligned control gates according to the present invention.

FIG. 11 is a circuit diagram of a surrounding-gate flash memory having a self-aligned control gate according to a preferred embodiment of the present invention. The reference numbers 160 and 162 represent two flash memory cells FM1 and FM2. The reference numbers 166 and 168 represent the control gates CG1 and CG2 on the flash memory cells FM1 and FM2, respectively. The reference numbers 176 and 178 represent the floating gates FG1 and FG2 of the flash memory cells FM1 and FM2, respectively. The reference number 164 represents the erasure gate E1 of the flash memory cells FM1 and FM2. The reference number 170 represents the common source CS of the flash memory cells FM1 and FM2. The reference numbers 172 and 174 represent the drains D1 and D2 of the flash memory cells FM1 and FM2. According to the surrounding-gate flash memory of the present invention, the reading, the programming and the erasure of the memory cells FM1 and FM2 are summarized in table 1. When the programming of the flash memory cell FM1 is carried out, the drain D1 is grounded to the substrate. A potential, for example, 10 V, of slightly larger than the critical voltages (for example, 6 V) of, for example, is applied to the control gate CG1 of the flash memory cell FM1. The electrons then flow from the common source CS through the channel region under the tunnel oxide layer 120, into the floating gate FG1, and to be stored in the floating gate for programming. The programming of the flash memory cell FM2 can be carried out in the same way.

TABLE 1

| CG1 | CG2 | D1 | CS | substrate | E1 |
|---|---|---|---|---|---|
| The programming of the flash memory cell FM1 ||||||
| 10 V | 0 V | 0 V | 7 V | 0 V | — |
| The programming of the flash memory cell FM2 ||||||
| 0 V | 10 V | 0 V | 7 V | 0 V | — |
| The erasure of the flash memory cells FM1 and FM2 ||||||
| 0 V | 0 V | free | free | 0 V | 16 V |
| The reading of the flash memory cell FM1 ||||||
| 5 V | 0 V | 2 V | 0 V | 0 V | — |

In the case that an erasure of the flash memory cells FM1 and FM2 is carried out, the control gates CG1 and CG2 are grounded to the substrate. A voltage, for example 16V, is applied to the erasure gate E1, a free voltage, for example, 10 V, is applied to the common source CS, drains D1 and D2. The electrons stored in the floating gates FG1 and FG2 will be emitted from the erasure gate E1 and the applied common source CS or drains D1 and D2 to accomplish the erasure process.

In the case that the reading of the flash memory cell FM1 is carried out, a voltage of about 5V is applied on the control gate CG1, and a voltage of about 2V is applied on the drain D1. If no electron is stored in the floating gate FG1, the potential applied on the control gate CG1 will generate a channel on the surface of the substrate under the gate. The electrons will flow from the source CS having a lower potential to the drain D1 having higher potential, such that the signals can be read. In the case that some electrons are stored in the floating gate FG1, the voltage applied on the control gate CG1 can not generate a channel on the surface of the substrate under the gate, and electrons will not flow from the lower potential common source CS to the higher potential drain D1. The signals thus can not be read.

It will be apparent to those skilled in the art that various modifications and variations can be made to the structure of the present invention without departing from the scope or spirit of the invention. In view of the foregoing, it is intended that the present invention cover modification and variation of this invention provided they fall within the scope of the following claims and their equivalents.

What is claimed is:

1. A process for fabricating a self-aligned flash memory, applicable to a substrate, the process comprising:

forming a plurality of device isolation structures on the substrate, each group of the device isolation structures are roughly parallel to each other, each group of the device isolation structures comprises a plurality of device isolation structures and are roughly parallel to each other, a strip-shaped source region is provided between each two groups of the device isolation structures, and a plurality of block-shaped drain regions are provided between each group of the device isolation structures;

forming sequentially a tunneling oxide layer, a first polysilicon layer, a mask layer and a first patterned photoresist layer on the substrate;

etching the mask layer by using the first patterned photoresist layer as a mask layer to form a plurality of openings, wherein the openings expose a surface of the first polysilicon layer;

removing the first patterned photoresist;

oxidizing the first polysilicon layer exposed by the openings to form a plurality of field silicon oxide isolation layers;

removing the mask layer;

etching the first polysilicon layer by using the field silicon oxide isolation layers as masks and the tunneling oxide layer as a etching-stop layer to form a plurality of polysilicon blocks;

forming a second patterned photoresist layer to expose the strip-shaped source region;

forming a source in the source region;

removing the second photoresist layer;

forming a first silicon oxide layer on asidewall of the polysilicon block;

forming a conformal second polysilicon layer to cover the substrate;

etching the conformal second polysilicon layer using the tunnel silicon oxide layer as a stop layer;

forming a second silicon oxide on a surface of the etched second polysilicon layer;

forming a third polysilicon layer to cover a surface of the substrate;

forming a plurality of openings on the third polysilicon layer to expose said the drain region, a part of the second silicon oxide layer and a part of the field silicon oxide isolation layer;

forming a plurality of drains over the drain region;

removing the tunneling oxide layers located on the drains;

forming a dielectric layer to cover all structures;

forming a plurality of plugs, wherein lower ends of the plugs are connected to the drains and the upper ends of the plugs are exposed on a surface of the dielectric layer; and forming a plurality of conductive lines to electrically connect to the upper ends of the plugs.

2. The process for fabricating the self-aligned flash memory according to claim 1, wherein the method of forming device isolation structures includes forming a shallow trench isolation.

3. The process for fabricating the self-aligned flash memory according to claim 1, wherein the method of forming the device isolation structure includes local oxidation.

4. The process for fabricating the self-aligned flash memory according to claim 1, wherein the tunneling oxide layer, the first oxide layer and the second silicon oxide layer are formed by methods including thermal oxidation.

5. The process for fabricating the self-aligned flash memory according to claim 1, wherein the mask layer includes a chemically vapor deposited silicon nitride layer.

6. The process for fabricating the self-aligned flash memory according to claim 1, wherein a method of etching the first polysilicon layer includes selective anisotropic etching.

7. The process for fabricating the self-aligned flash memory according to claim 1, wherein a method of forming the sources and the drains includes ion implantation.

8. The process for fabricating the self-aligned flash memory according to claim 1, wherein a method of forming the conformal second polysilicon layer includes chemical vapor deposition.

9. The process for fabricating the self-aligned flash memory according to claim 1, wherein methods of forming the conformal second polysilicon layer and the third polysilicon layer include a self-aligned selective anisotropic etching.

10. The process for fabricating the self-aligned flash memory according to claim 1, wherein a method of removing the tunneling oxide layer located over the drains includes anisotropic etching.

* * * * *